(12) United States Patent
Pai et al.

(10) Patent No.: US 7,781,680 B2
(45) Date of Patent: Aug. 24, 2010

(54) FLEXIBLE PRINTED CIRCUIT BOARD

(75) Inventors: Yu-Chang Pai, Taipei Hsien (TW);
Shou-Kuo Hsu, Taipei Hsien (TW);
Chien-Hung Liu, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 225 days.

(21) Appl. No.: 11/951,290

(22) Filed: Dec. 5, 2007

(65) Prior Publication Data

US 2009/0078452 A1 Mar. 26, 2009

(30) Foreign Application Priority Data

Sep. 21, 2007 (CN) .................... 2007 1 0201819

(51) Int. Cl.
*H05K 1/00* (2006.01)
(52) U.S. Cl. ........................ 174/254; 361/777
(58) Field of Classification Search .............. 174/254, 174/255, 261, 27, 36, 113 R; 361/777, 780, 361/794–796; 333/4, 5, 33, 238, 246; 257/662, 257/664, 698, 758; 29/847
See application file for complete search history.

(56) References Cited

U.S. PATENT DOCUMENTS

| 5,828,555 | A * | 10/1998 | Itoh | 361/784 |
| 6,373,740 | B1 * | 4/2002 | Forbes et al. | 365/51 |
| 6,384,341 | B1 * | 5/2002 | Rothermel et al. | 174/255 |
| 6,420,778 | B1 * | 7/2002 | Sinyansky | 257/664 |
| 2006/0061432 | A1 * | 3/2006 | Hsu et al. | 333/33 |

* cited by examiner

*Primary Examiner*—Jinhee J Lee
*Assistant Examiner*—Yuriy Semenenko
(74) *Attorney, Agent, or Firm*—Frank R. Niranjan

(57) ABSTRACT

An exemplary FPCB includes a differential pair consisting of a first transmission line and a second transmission line, a signal layer with the first transmission line arranged therein, a ground layer having a void which includes the area beneath the first transmission line, and a dielectric layer lying between the signal layer and the ground layer. The second transmission line is arranged in the ground layer offset from the first transmission line in the horizontal direction. The FPCB can transmit high speed signals.

4 Claims, 2 Drawing Sheets

FLEXIBLE PRINTED CIRCUIT BOARD

BACKGROUND

1. Field of the Invention

The present invention relates to a flexible printed circuit board (FPCB), and particularly to an FPCB for transmitting high speed signals.

2. Description of Related Art

FPCBs are light, soft, thin, ductile, flexible and support high wiring density. FPCBs can be three-dimensionally wired and shaped according to space limitations. Flexible circuits are typically useful for electronic packages where flexibility, weight control and the like are important.

Referring to FIG. 2, a conventional FPCB includes a signal layer and a ground layer 50, a differential pair 51 consisting of two transmission lines 52 and 54 is arranged in the signal layer, the ground layer 50 is formed vertically beneath the signal layer and etched in a grid array. The layout in the ground layer 50 beneath the transmission line 52 is different from that beneath the transmission line 54, noise is easily generated, which prevents the FPCB transmitting high speed signals.

What is needed, therefore, is a FPCB which can transmit high speed signals.

SUMMARY

An exemplary FPCB includes a differential pair consisting of a first transmission line and a second transmission line, a signal layer with the first transmission line arranged therein, a ground layer having a void which includes the area beneath the first transmission line, and a dielectric layer lying between the signal layer and the ground layer. The second transmission line is arranged in the ground layer offset from the first transmission line in the horizontal direction.

Other advantages and novel features will become more apparent from the following detailed description when taken in conjunction with the accompanying drawings, in which:

DETAILED DESCRIPTION

Figure 1:
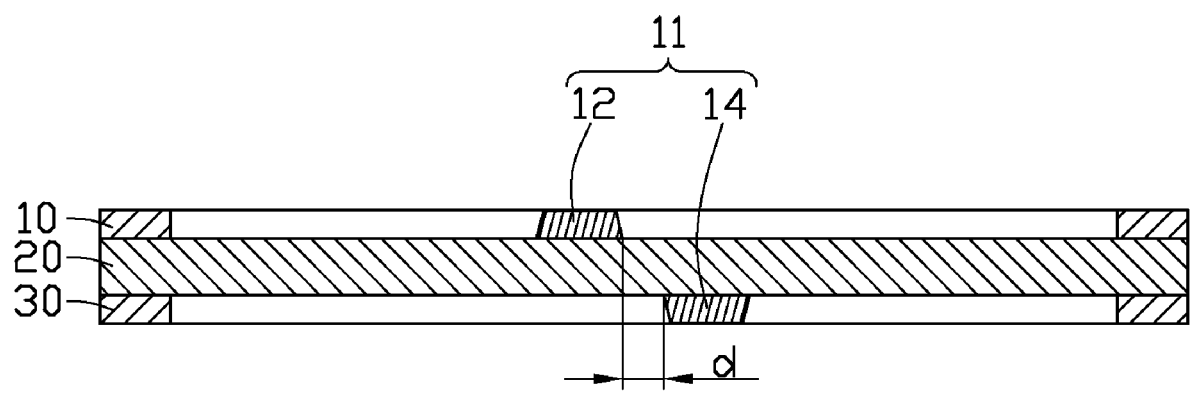
FIG. 1 is a cross-sectional view of an FPCB according to an embodiment of the present invention.

Referring to FIG. 1, an FPCB in accordance with an embodiment of the present invention includes a signal layer 10, a ground layer 30, and a dielectric layer 20 lying between the signal layer 10 and the ground layer 30. A differential pair 11 includes two transmission lines 12 and 14, the transmission line 12 is arranged in the signal layer 10. A void is defined in the ground layer 30 which includes the area beneath the transmission line 12, ensuring enough distance between the transmission line 12 and the ground layer 30, to avoid low characteristic impedance problems. The transmission line 14 is arranged in the ground layer 30 horizontally offset a distance d from the transmission line 12.

The length of the distance d is obtained by simulating the FPCB of FIG. 1 in a conventional simulation software, simulating the signal type to be transmitted through the transmission lines 12 and 14 and the desired impedance of the transmission line, and adjusting the distance d and the width of the void, until desired characteristic impedances of the transmission lines 12 and 14 are achieved. The distance d is also affected by the following factors: the width of each transmission line 12, 14; and the height of the dielectric layer 20. Generally, when the signal transmission lines 12 and 14 transmit IEEE 1394 signals, the width of each transmission line 12 and 14 should be 4 mils, and the distance d should be 4 mils; when the signal transmission lines 12 and 14 transmit PCI-EXPRESS signals, the width of each transmission line 12 and 14 should be 4 mils, and the distance d should be 2.5 mils; when the signal transmission lines 12 and 14 transmit USB signals, the width of each transmission line 12 and 14 should be 4 mils, the length of the distance d should be 1.5 mils.

Figure 2:
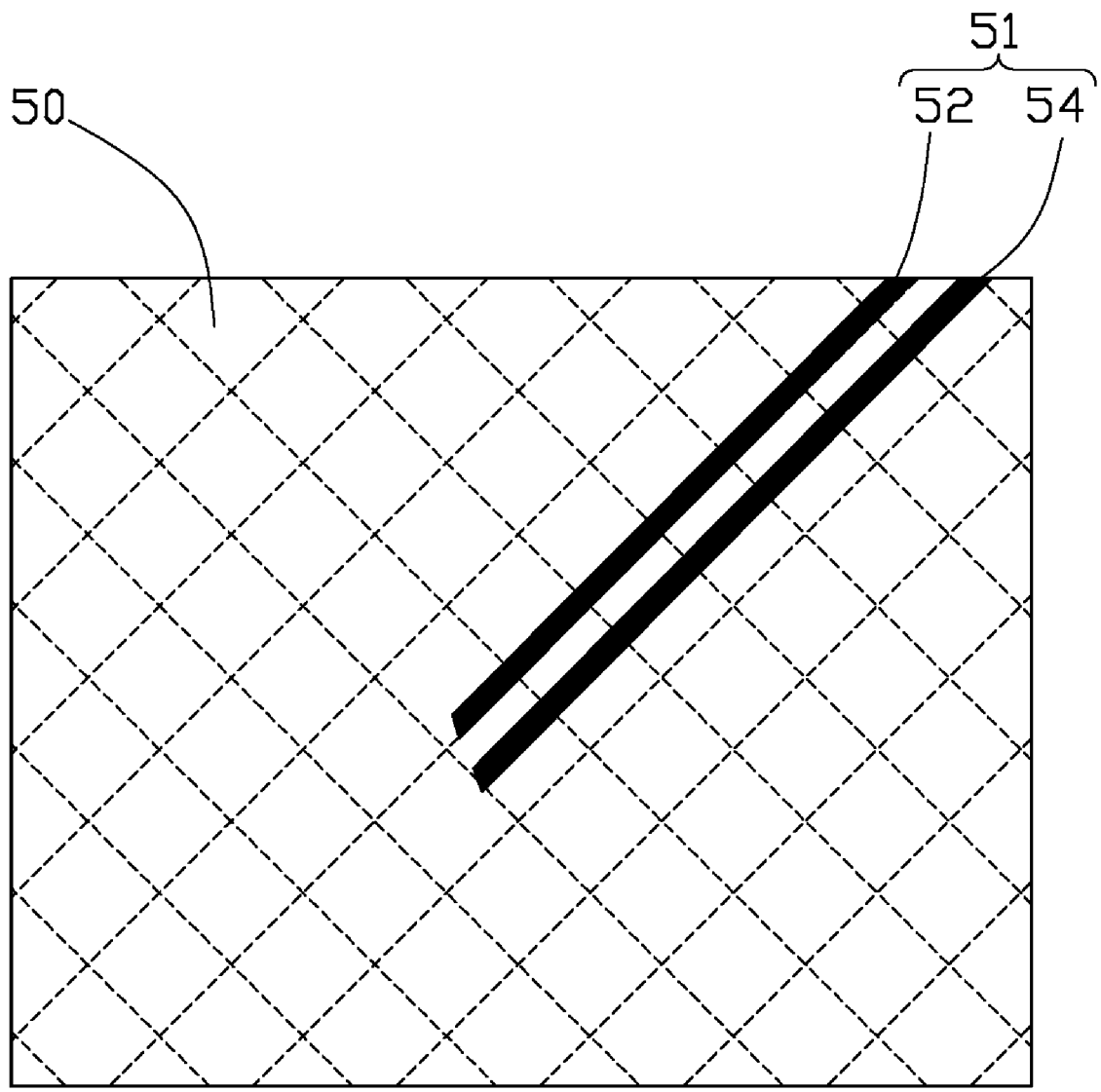
FIG. 2 is a schematic diagram of a conventional FPCB.

The two transmission lines 12 and 14 are arranged in the signal layer and the ground layer respectively, and the noise caused by the grid array construction of the ground layer in FIG. 2 is reduced, and the impedance of the transmission line is matched, so the FPCB of the embodiment of the present invention can transmit high speed signals. No new manufacturing steps are added to make the FPCB of the present invention, only changes in designing the layout the FPCB are needed, so the FPCB of the present invention has low noise, low cost, and can transmit high speed signals.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A flexible printed circuit board (FPCB), comprising:
   a differential pair comprising a first transmission line and a second transmission line;
   a signal layer with the first transmission line arranged therein;
   a ground layer having a void which includes the area located beneath the first transmission line, the second transmission line arranged in the ground layer and horizontally offset from the first transmission line; and
   a dielectric layer lying between the signal layer and the ground layer.

2. The FPCB as claimed in claim 1, wherein the width of each of the first and second transmission lines is 4 mils, and the horizontal offset between the first transmission line and the second transmission line is 4 mils.

3. The FPCB as claimed in claim 1, wherein the width of each of the first and second transmission lines is 4 mils, the length of the horizontal offset between the first transmission line and the second transmission line is 2.5 mils.

4. The FPCB as claimed in claim 1, wherein the width of each of the first and second transmission lines is 4 mils, the length of the horizontal offset between the first transmission line and the second transmission line is 1.5 mils.

* * * * *